United States Patent
Jutzi et al.

(10) Patent No.: US 10,901,203 B2
(45) Date of Patent: Jan. 26, 2021

(54) DEVICES FOR DEFLECTING A LASER BEAM IN A TWO-DIMENSIONAL MANNER

(71) Applicant: TRUMPF Schweiz AG, Gruesch (CH)

(72) Inventors: Fabio Jutzi, Chur (CH); Dara Bayat, Neuchaetel (CH); Sebastien Lani, Courtepin (CH)

(73) Assignee: TRUMPF Schweiz AG, Gruesch (CH)

( * ) Notice: Subject to any disclaimer, the term of this patent is extended or adjusted under 35 U.S.C. 154(b) by 344 days.

(21) Appl. No.: 16/032,379

(22) Filed: Jul. 11, 2018

(65) Prior Publication Data

US 2018/0329202 A1    Nov. 15, 2018

Related U.S. Application Data

(63) Continuation of application No. PCT/EP2017/050212, filed on Jan. 5, 2017.

(30) Foreign Application Priority Data

Jan. 12, 2016  (EP) ..................... 16150891

(51) Int. Cl.
  *G02B 26/08*  (2006.01)
  *B81B 3/00*   (2006.01)
(52) U.S. Cl.
  CPC ........ *G02B 26/0841* (2013.01); *B81B 3/0051* (2013.01); *G02B 26/085* (2013.01);
  (Continued)
(58) Field of Classification Search
  None
  See application file for complete search history.

(56) References Cited

U.S. PATENT DOCUMENTS

| 6,198,180 B1 * | 3/2001 | Garcia ................. B81B 3/0062 |
| | | 310/36 |
| 6,384,952 B1 * | 5/2002 | Clark .................... G02B 26/06 |
| | | 359/224.1 |

(Continued)

FOREIGN PATENT DOCUMENTS

| EP | 1950174 | 7/2008 |
| JP | 2015533652 | 11/2015 |

OTHER PUBLICATIONS

Ataman et al., "Paper;A dual-axis pointing mirror with moving-magnet actuation;A dual-axis pointing mirror with moving-magnet actuation," Journal of Micromechanics & Microengineering, Dec. 2012, 23: 025002.

(Continued)

*Primary Examiner* — Jennifer D. Carruth
(74) *Attorney, Agent, or Firm* — Fish & Richardson P.C.

(57) ABSTRACT

This disclosure relates to devices for two-dimensional deflection of a laser beam, which include a substrate having a substrate opening, a spring membrane provided on the substrate having spring arms extending over the substrate opening, and a middle section arranged in the substrate opening and supported by the spring arms. The middle section is mounted so it is two-dimensionally tiltable and is axially displaceable in both directions of the spring membrane middle axis. The device includes a mirror fastened on the middle section of the spring membrane and a magnetic or electrostatic drive for tilting the mirror against the restoring force of the spring arms. One or more of a component coupled to the mirror and an end stop unit are configured to limit axial deflection of the middle section to a distance that is within a range of axial deflection of the middle section during the drive-related tilting of the mirror.

30 Claims, 5 Drawing Sheets

(52) U.S. Cl.
CPC ... *B81B 2201/042* (2013.01); *B81B 2203/053* (2013.01); *B81B 2203/058* (2013.01)

(56) References Cited

U.S. PATENT DOCUMENTS

| | | | |
|---|---|---|---|
| 7,800,280 B2 | 9/2010 | Jeong et al. | |
| 7,977,207 B2 | 7/2011 | Jeong et al. | |
| 2002/0101644 A1* | 8/2002 | Mei | G02B 26/0841 |
| | | | 359/290 |
| 2003/0053232 A1 | 3/2003 | Dalziel | |
| 2004/0001263 A1 | 1/2004 | Staker et al. | |
| 2004/0061962 A1 | 4/2004 | Kwon | |
| 2004/0190097 A1* | 9/2004 | Shpizel | G02B 26/0833 |
| | | | 359/220.1 |
| 2006/0126151 A1* | 6/2006 | Aksyuk | G02B 26/0841 |
| | | | 359/291 |
| 2014/0177020 A1 | 6/2014 | Hino et al. | |
| 2014/0211187 A1 | 7/2014 | Hauf et al. | |
| 2017/0325030 A1* | 11/2017 | Stoppel | H04R 17/00 |
| 2017/0351088 A1* | 12/2017 | Aoyagi | H04N 1/113 |

OTHER PUBLICATIONS

International Search Report and Written Opinion in International Application No. PCT/EP2017/050212, 25 pages (with English translation).

International Preliminary Report on Patentability in International Application No. PCT/EP2017/050212, dated Jul. 26, 2018, 20 pages (English translation).

* cited by examiner

DEVICES FOR DEFLECTING A LASER BEAM IN A TWO-DIMENSIONAL MANNER

CROSS REFERENCE TO RELATED APPLICATIONS

This application is a continuation of and claims priority under 35 U.S.C. § 120 from PCT Application No. PCT/EP2017/050212 filed on Jan. 5, 2017, which claims priority from EPO Application No. EP 16 150 891.6, filed on Jan. 12, 2016. The entire contents of each of these priority applications are incorporated herein by reference.

TECHNICAL FIELD

The invention relates to devices for two-dimensional deflection of a laser beam.

BACKGROUND

Ataman et al., J. Micromech. Microeng. 23 (2013) 025002 (13 pp) and T. Iseki et al., OPTICAL REVIEW Vol. 13, No. 4 (2006) 189-194 disclose devices for deflecting laser beams on the basis of a MEMS (microelectromechanical systems) technology having an electromagnetic drive in the form of flat coils.

Devices for deflecting laser beams, in particular microscanners in arrangements for laser material processing, offer a high dynamic response with respect to angular velocity and angular acceleration and also offer a high accuracy with respect to angular settings and repeatability. At the same time, the performance of the laser beams being used is continuously improving and the installation spaces are gradually becoming smaller. Certain laser processing systems employ scanner mirrors based on MEMS electromagnetic or electrostatic drives.

To achieve high dynamic response and linearity in the tilting of a mirror in deflection devices known from the above-mentioned article, the spring membrane in particular cannot be designed as very rigid in the axial direction. Implementing a system using a rigid axial spring membrane can result in the spring arms of the spring membrane be plastically deformed or fractured in the event of high axial forces (for example, acceleration by impacts, as can occur in particular during transportation).

EP 1 950 174 A2 discloses a device for the one-dimensional deflection of a laser beam by means of a mirror fastened on a middle section. The middle section is mounted in a substrate opening so it is pivotable about a tilt axis, which is defined by two torsion spring arms. The middle section is integrally connected to the substrate. To delimit the axial displacement of the middle section in both directions, two stoppers are provided. The first stopper is fastened on top of the opening edge of the substrate and overlaps the middle section, while the second stopper is provided on the middle section and overlaps the opening edge of the substrate.

EP 1 950 174 A2 discloses a device in which neither a spring membrane nor a two-dimensionally tiltable mounted middle section or mirror for the two-dimensional deflection of a laser beam is provided. Instead, EP 1 950 174 A2 discloses a device for two-dimensional deflection of a laser beam by means of a gimbal-mounted mirror, wherein two stoppers delimit the axial displacement of an outer ring of the gimbal mounting in both axial directions.

US 2004/061962 A1 discloses a device for the two-dimensional deflection of a laser beam by means of a mirror fastened on a pedestal, which is mounted so it is two-dimensionally tiltable by means of perpendicular gimbal springs. The gimbal springs are respectively fastened at the other ends on four connecting arms, which are each connected to electrostatic or magnetic actuators. By corresponding activation of electrodes below the actuators, the connecting arms including the spring-mounted pedestal or mirror can be tilted two-dimensionally, wherein a stop delimits the axial displacement of the pedestal downward. The gimbal springs are thus not supported fixed in place, for example, on a substrate, but rather on the tilt-movable actuators. A spring membrane supporting the pedestal, the spring arms of which extend into the substrate opening, is in any case not known from US 2004/061962 A1.

SUMMARY

The present disclosure relates to deflection devices having a substrate including a substrate opening and a spring membrane provided on the substrate. The devices are structured to prevent plastic deformation or fracturing of the spring membrane, i.e., of specifying a deflection device that has limited sensitivity to impacts. The spring membrane is positioned on the substrate about a spring membrane middle axis. The spring membrane middle axis extends through the substrate opening and the spring membrane. The spring membrane includes spring arms extending from the substrate and over the substrate opening. The spring membrane includes a middle section positioned over the substrate opening, wherein the middle section is supported by the spring arms and is mounted to be two-dimensionally tiltable and axially displaceable in both directions along the spring membrane middle axis. The devices include a mirror that is coupled to the middle section of the spring membrane. The devices include at least one of a magnetic and an electrostatic drive configured to tilt the mirror against a restoring force of the spring arms.

In one aspect, one or more of a component coupled to the mirror and an end stop unit are configured to limit an axial deflection of the middle section, at least in an axial direction along the spring membrane middle axis, to a distance that is within a range of axial deflection of the middle section during the drive-related tilting of the mirror. The spring arms can be elastically deflected out of the plane of the spring membrane and extend from the edge of the substrate opening over the substrate opening.

The end stop unit according to certain embodiments of the invention is arranged outside the drive-related, maximum tilt angle range of the mirror of, for example, ±10° and outside a maximum displacement of the mirror possibly occurring in this case in the axial direction and positioned in such a way that the axial maximum deflection of the spring membrane remains restricted to the elastic deflection range, i.e., neither plastic deformations nor fractures of the spring membrane occur up to the contact of the component on the end stop unit. The end stop unit can in turn have a high elasticity, to damp the accelerations upon impacts of the component and thus limit the forces. The spring membrane is typically attached to a substrate or etched out of a substrate, wherein the spring arms can extend, for example, linearly, or in a spiral, zigzag, or S shape.

In particular implementations, the end stop unit is formed by one or more end stop arms of the spring membrane, which protrude into the substrate opening up into the movement path of the component, to stop the axial movement of the component with the springy free ends thereof. The end stop arms can be etched directly into the device layer of an SOI (silicon-on-insulator) silicon wafer and are advantageously arranged at equal angle intervals in relation to one another and at a sufficient spacing from the spring arms so as not to block the movement thereof. The end stop arms preferably have a higher spring stiffness than the spring arms, which can be achieved, for example, by a larger cross section of the end stop arms.

In particular implementations, the end stop unit is formed by one or more end stop arms of the substrate, which protrude into the substrate opening up into the movement path of the component, to stop the axial movement of the component with the free ends thereof. The end stop arms can be etched directly into the handle layer of an SOI silicon wafer and are advantageously arranged at equal angle intervals in relation to one another and at sufficient spacing from the spring arms so as not to block the movement thereof.

In particular implementations, the end stop unit is formed by an aperture diaphragm, for example, a perforated film, which protrudes with its opening edge or with end stop arms into the substrate opening up into the movement path of the component, to stop the axial movement of the component with its opening edge. For example, the cross section of the hole, in particular the diameter of the hole, can be smaller than the cross section of the component, in particular the diameter of the component. The aperture diaphragm can be arranged on the side of the substrate opposite to the spring membrane and can be fastened, for example, on the side of the substrate opposite to the spring membrane.

The component that cooperates with the end stop unit can be arranged on the side of the middle section opposite to the mirror and in particular can be fastened thereon. In certain embodiments, the aperture diaphragm is arranged between the mirror and the spring membrane.

In particular implementations, the component that cooperates with the end stop unit is the spring membrane, a permanent magnet, a solenoid coil of a magnetic drive, or an electrode of an electrostatic drive, i.e., a drive component of the magnetic or electrostatic drive that is fastened on the mirror in any case. Alternatively, the component that cooperates with the end stop unit can also be a component without drive function, for example, a stop disk. The further component can be formed by a separate stop plate or by at least one projection protruding radially outward of a spacer located between permanent magnet and spring membrane.

The axial deflection of the middle section can also be delimited in the other axial direction by a further end stop unit, which also cooperates with a component rigidly fastened on the mirror and can be constructed in principle identically to the above-described end stop unit. In certain implementations, the further end stop unit is also arranged outside the drive-related, maximum tilt angle range of the mirror of, for example, ±10° (e.g., 1, 2, 3, 4, 5, 6, 7, 8, or 9°) and outside a maximum displacement of the mirror possibly occurring in this case in the other axial direction and is positioned in such a way that the axial maximum deflection of the spring membrane remains restricted to the elastic deflection range, i.e., neither plastic deformations nor fractures of the spring membrane occur up to the contact of the component on the further end stop unit. The end stop unit can in turn have a high elasticity, to dampen the accelerations upon impacts of the component and thus limit the forces.

The further end stop unit can be implemented, however, by an end stop arranged in the movement path of the component, for example, a stop plate arranged in front of the substrate opening, a flat coil printed circuit board, or an axial spike arranged in the middle in front of the component.

A damper can advantageously be arranged between the end stop unit and the component cooperating therewith, in particular fastened on the end stop unit or on the component. The damper can be implemented on the component, for example, by a polymer coating, for example, a parylene coating.

The deflection device according to certain implementations is embodied in MEMS (Micro-Electro-Mechanical Systems) technology.

A force-exerting component, for example, a permanent magnet, of the magnetic or electrostatic drive can be rigidly connected to the mirror. Furthermore, the spring membrane can be situated spaced apart respectively between the mirror and a force-exerting component (for example, a permanent magnet) of the magnetic or electrostatic drive. The end stop unit can advantageously be formed by the substrate, the spring membrane, or a layer applied to the substrate.

Further advantages and advantageous embodiments of the subject matter of the invention result from the description, the claims, and the drawings. The above-mentioned features and the features set forth hereafter can also be used per se or in a plurality in arbitrary combinations. The embodiments shown and described are not to be understood as an exhaustive list, but rather have exemplary character for the description of the invention.

DETAILED DESCRIPTION

In the following description of the figures, identical reference signs are used for identical or functionally-identical components.

Figure 1A:
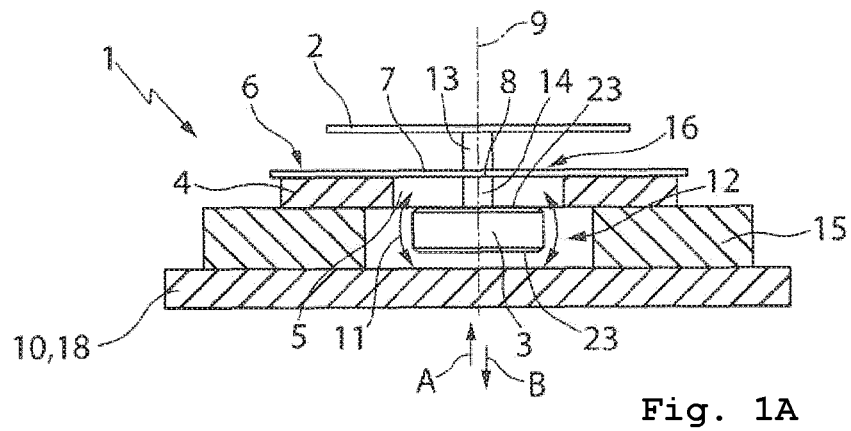
FIGS. 1A, 1B show a longitudinal section of a first device according to the invention for the two-dimensional deflection of a laser beam having a tiltable mirror, which is shown in FIG. 1A in an axially non-deflected position and in FIG. 1B in its axially deflected, upper end position.
Figure 1B:
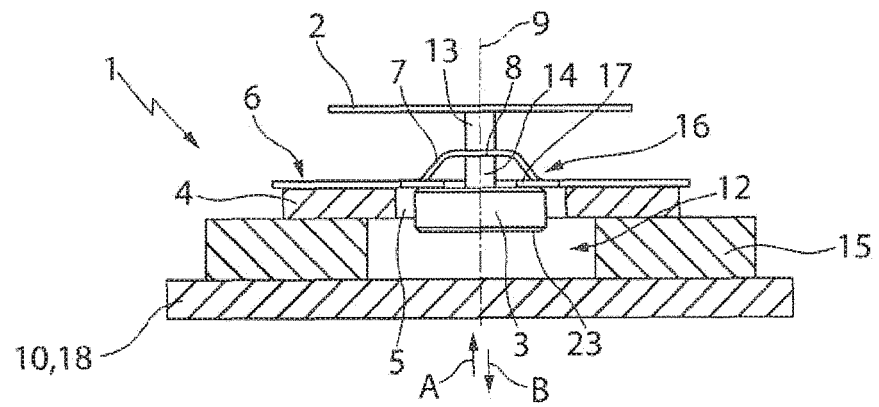

The device 1 shown in FIGS. 1A, 1B is used for the two-dimensional deflection of a laser beam by means of a mirror 2 mounted so it is two-dimensionally tiltable. In addition to the mirror 2, the deflection device 1 has the following further components: a permanent magnet 3 rigidly connected to the mirror 2, a substrate 4 having a substrate opening 5, a spring membrane 6 provided on the substrate 4, which has spring arms 7 extending over the substrate opening 5 and a middle section 8, which is arranged in the substrate opening 5 and supported by the spring arms 7, and which is mounted so it is tiltable and is axially displaceable in both directions A, B of the spring membrane middle axis 9, wherein the mirror 2 is fastened on the one side, which is on top in FIG. 1, of the middle section 8, and a solenoid coil 10, configured as a flat coil printed circuit board, for generating a magnetic field, to tilt the permanent magnet 3 with mirror 2 against the restoring force of the spring arms 7 about any arbitrary tilt axis, extending perpendicularly to the middle axis 9, of the middle section 8, as indicated by double arrows 11 for the tilt axis of the middle section 8 extending perpendicularly to the plane of the drawing. The spring arms 7 can be elastically deflected out of the plane of the spring membrane 6 and extend from the edge of the substrate opening 5 into the substrate opening 5.

The permanent magnet 3 and the solenoid coil 10 therefore jointly form an electromagnetic drive, which is identified as a whole by 12, for tilting the mirror 2 against the restoring force of the spring arms 7. The mirror 2 is fastened by means of an upper spacer 13 on the upper side and the permanent magnet 3 is fastened by means of a lower spacer 14 on the lower side of the middle section 8 and is thus held suspended on the spring membrane 6. The substrate 4 is fastened by means of a frame 15 on the flat coil printed circuit board 10, which is therefore located below the permanent magnet 3. In particular implementations, the mirror 2 and the upper spacer 13 are integrally etched out of an SOI (silicon-on-insulator) silicon wafer (for example, Si/SiO2/Si sandwich), wherein the upper spacer 13 consists of a different silicon layer than the mirror 2. Alternatively, the upper spacer 13 can also be a separate component that is installed separately on the mirror 2.

Figure 2:
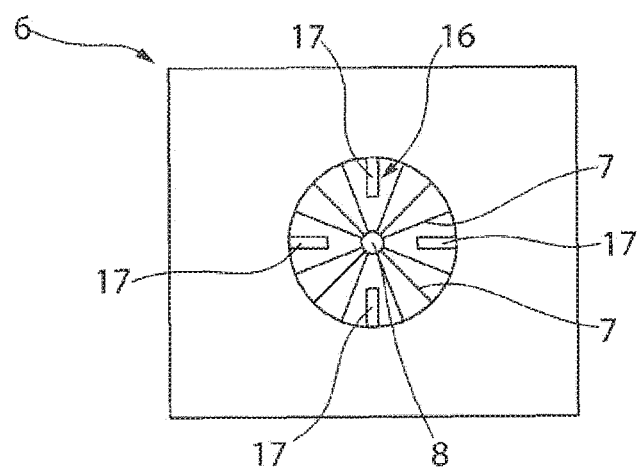
FIG. 2 shows a top view of a spring membrane shown in FIG. 1.

An axial deflection of the middle section 8 upward (direction A) is limited to a range of an axial deflection of the middle section 8 during the tilting of the mirror 2 caused by the magnetic field by an upper end stop unit 16, which cooperates with the permanent magnet 3. As shown in FIG. 2, the end stop unit 16 is formed by multiple, four here, solely by way of example, end stop arms 17 of the spring membrane 6, which protrude into the substrate opening 5 up into the movement path of the permanent magnet 3, to stop the axial movement of the permanent magnet 3 upward with the free ends thereof. For this purpose, the end stop arms 17 have a significantly higher spring stiffness, for example, a greater width, than the spring arms 7. The end stop arms 17 are arranged at equal angle intervals to one another and at sufficient spacing from the spring arms 7 so as not to block the movement thereof. The maximum deflection of the mirror 2 upward shown in FIG. 1B is delimited by the end stop unit 16, typically to about 300 µm.

In particular implementations, the spring membrane 6 is a silicon spring membrane. For example, the middle section 8 and the spring arms and end stop arms 7, 17 can be produced directly in the device layer of an SOI (silicon-on-insulator) silicon substrate 4 by etching or applied as a coating to the substrate 4, wherein the spring arms 7, as shown, can extend linearly, but also in a spiral, zigzag, or S shape.

The flat coil printed circuit board 10 below the permanent magnet 3 delimits an axial deflection of the middle section 8 downward (direction B) to a range of axial deflection of the middle section 8 during the tilting of the mirror 2 caused by the magnetic field, and thus, forms a lower end stop unit 18 cooperating with the permanent magnet 3. The maximum deflection of the mirror 2 downward is delimited by the lower end stop unit 18, to 200 µm in certain implementations.

The two end stop units 16, 18 limit the vertical deflections of the spring arms 7 upward and downward, as can occur in the case of large vertical accelerations or vibrations, for example, as a result of impacts, and are situated outside the drive-related, maximum tilt angle range of the mirror 2 of, for example, ±10°. The spring membrane 6 is dimensioned such that in the event of deflection up to the two end stop units 16, 18, the mechanical tensions of the spring membrane 6 are below the plastic deformation limit or the fracture limit.

In particular embodiments, the solenoid coil is alternatively arranged as a wound coil on the frame 15 and therefore outside the movement path of the permanent magnet 3. In the case of such a lateral coil, a stop plate can be fastened as the lower end stop unit 18 below the permanent magnet 3.

Figure 3:
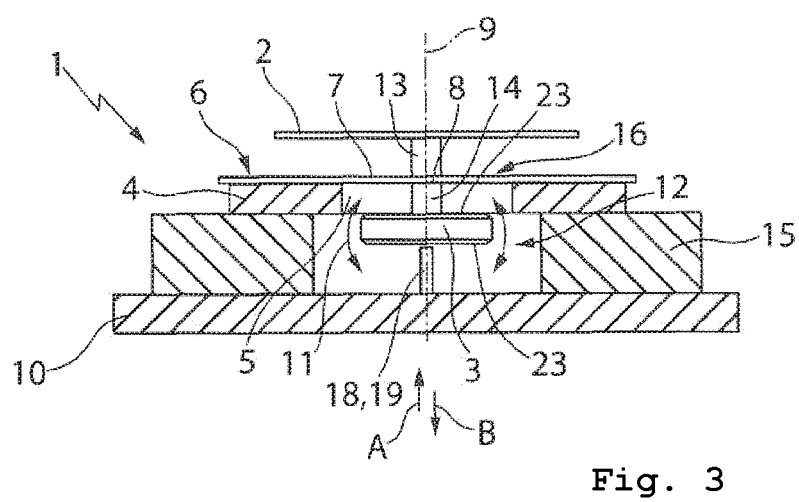
FIG. 3 shows the deflection device shown in FIG. 1 with a modified lower end stop unit, in a view similar to FIG. 1A.

The deflection device 1 shown in FIG. 3 differs from FIG. 1A in that here the lower end stop unit 18 is formed by a spike 19 protruding upward from the flat coil printed circuit board 10, against which the permanent magnet 3 abuts in its axially deflected, lower end position. With equal maximum tilt angle range of the mirror 2, the spike 19 can be placed at lesser spacing from the permanent magnet 3 than the flat coil printed circuit board 10.

Figure 4A:
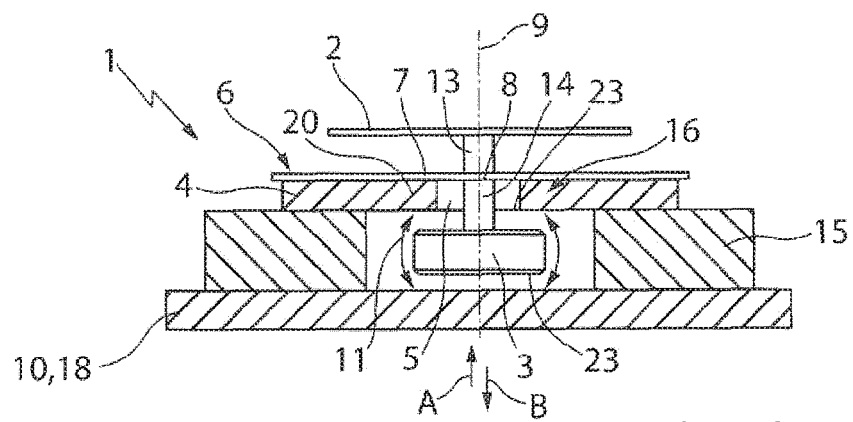
FIGS. 4A, 4B show a longitudinal section of a second deflection device according to the invention having a tiltable mirror, which is shown in FIG. 4A in an axially non-deflected position and in FIG. 4B in its axially deflected, upper end position.
Figure 4B:
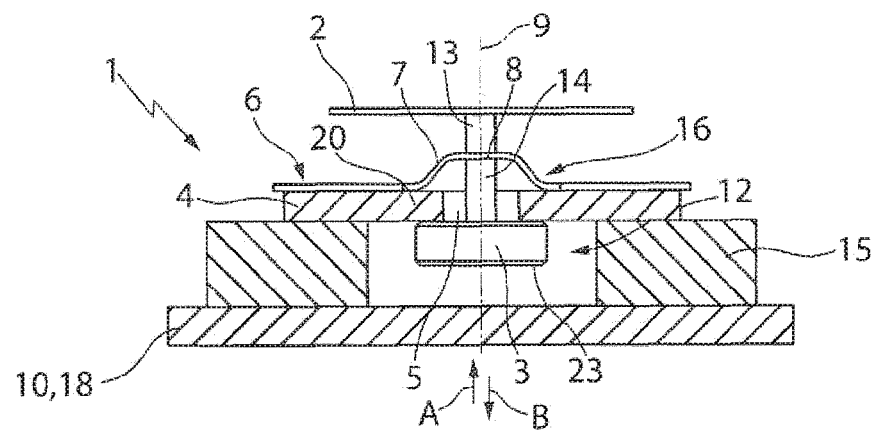
Figure 5:
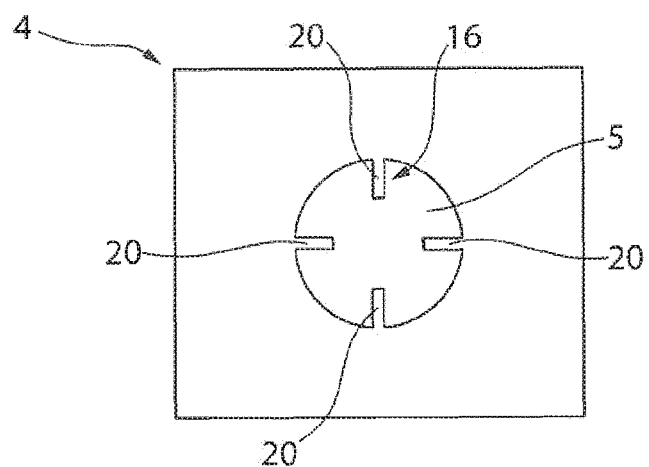
FIG. 5 shows a top view of a substrate shown in FIG. 4.

The deflection device 1 shown in FIGS. 4A, 4B differs from FIGS. 1A, 1B in that here the upper end stop unit 16 is formed by multiple, four here (solely by way of example), end stop arms 20 of the substrate 4, which protrude into the substrate opening 5 up into the movement path of the permanent magnet 3, to stop the axial movement of the permanent magnet 3 upward with the free ends thereof. The end stop arms 20 can be produced in the handle layer of an SOI (silicon-on-insulator) silicon substrate 4 by etching and are arranged, in certain implementations, as shown in FIG. 5, at equal angle intervals from one another. The end stop arms 20 have to be situated with sufficient lateral spacing from the spring arms 7 so as not to block the movement thereof.

Figure 6:
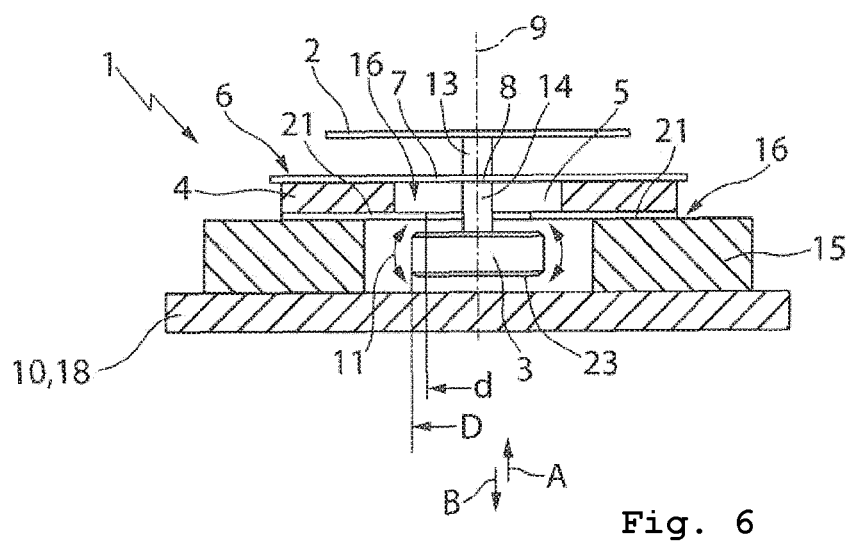
FIG. 6 shows a longitudinal section of a third deflection device according to the invention having a tiltable mirror, which is shown in an axially non-deflected position.

The deflection device 1 shown in FIG. 6 differs from FIG. 1A in that here the permanent magnet 3 is arranged between the flat coil printed circuit board 10 and an aperture diaphragm 21. The aperture diaphragm 21 is fastened on the lower side of the substrate 4 opposite to the spring membrane 6, wherein the hole diameter d is smaller than the diameter D of the permanent magnet 3. The aperture diaphragm 21 can be a perforated film, for example, a polyimide film. The aperture diaphragm 21 forms the upper end stop unit 16 and protrudes into the substrate opening 5 up into the movement path of the permanent magnet 3, to stop the axial movement of the permanent magnet 3 upward with its opening edge. Alternatively, the aperture diaphragm 21 can also have end stop arms that extend enough toward the middle that they stop the permanent magnet 3 during vertical movement upward.

Figure 7:
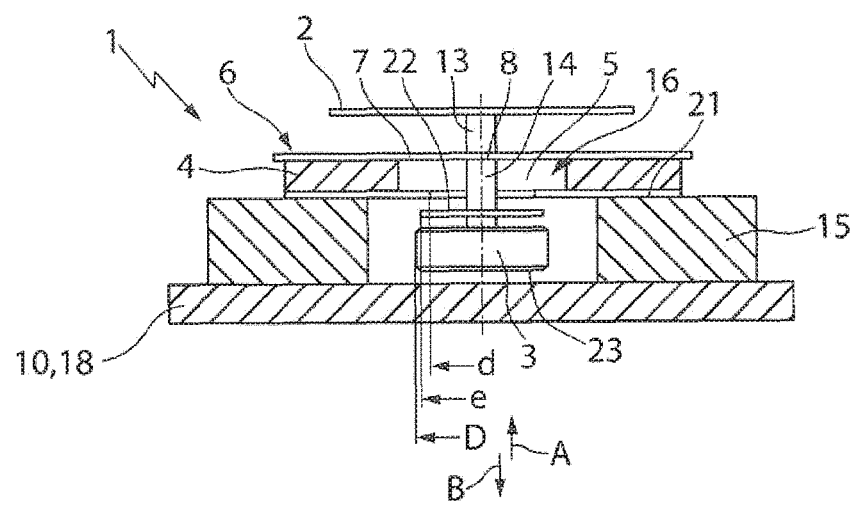
FIG. 7 shows a longitudinal section of a fourth deflection device according to the invention having a tiltable mirror, which is shown in an axially non-deflected position.

The deflection device 1 shown in FIG. 7 differs from FIG. 6 in that here the upper end stop unit 16 is formed by the aperture diaphragm 21 and a stop plate (for example, small aluminum plate) 22, which is fastened between permanent magnet 3 and aperture diaphragm 21 on the spacer 14. The diameter of the stop plate 22 is larger than the hole diameter d and, as shown in FIG. 7, can be smaller than the diameter D of the permanent magnet 3. The aperture diaphragm 21 protrudes into the substrate opening 5 up into the movement path of the stop plate 22, to stop the axial movement of the stop plate 22 upward with its opening edge or with its end stop arms. Instead of a separate stop plate, the lower spacer 14 can also have at least one projection 22 protruding radially outward, for example, a bulge or a ring shoulder, which cooperates with the aperture diaphragm 21.

Instead of cooperating with a separate aperture diaphragm, the stop plate 22 or the at least one projection protruding radially outward can alternatively also cooperate with the end stop arms 17, 20 of the spring membrane 6 or the substrate 4, respectively, as described in FIGS. 1A and 4A.

As shown in the drawings, the permanent magnet 3 can be provided on the upper and lower sides with a polymer coating 23, additionally to dampen the impact at the end stop unit 16, 18. Alternatively or additionally, the end stop unit 16, 18 can also have a damping polymer coating.

Figure 8:
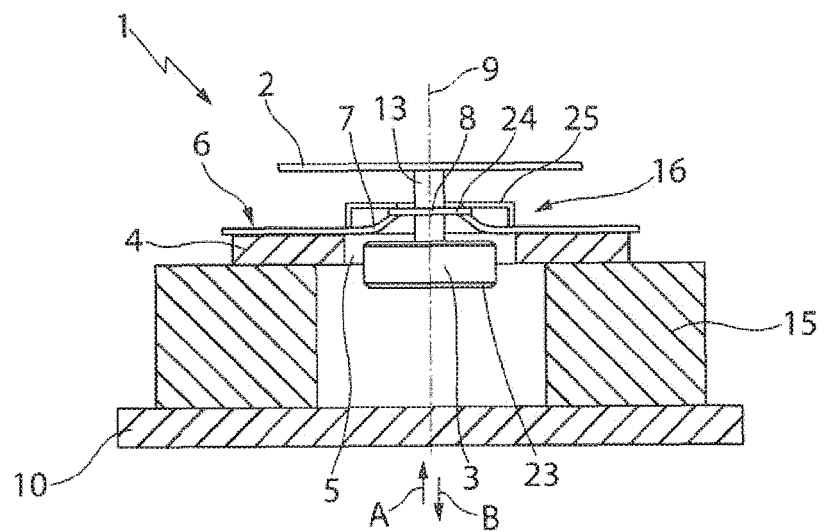
FIG. 8 shows a longitudinal section of a fifth deflection device having a tiltable mirror, which is shown in its axially deflected, upper end position.
Figure 9:
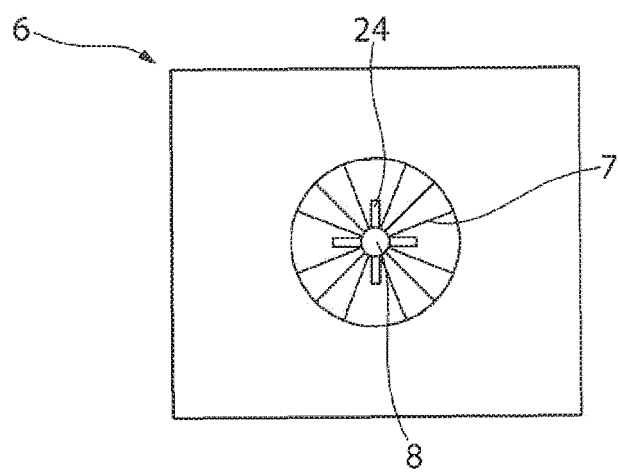
FIG. 9 shows a top view of a spring membrane shown in FIG. 8.

A further example of a deflection device 1 is shown in FIGS. 8 and 9, in which the middle section 8 has end stop arms 24 extending radially outward and a aperture diaphragm 25 fastened on the substrate 4 is arranged above the spring membrane 6. The aperture diaphragm 25 forms the upper end stop unit 16 and protrudes into the substrate opening 5 up into the movement path of the end stop arms 24, to stop the axial movement upward of the spring membrane 6 and the permanent magnet 3. FIG. 8 shows the mirror 2 in its axially deflected, upper end position, in which the end stop arms 24 abuts against the aperture diaphragm 25.

In contrast to the deflection devices shown, in which the solenoid coil 10 is connected fixed in place and the permanent magnet 3 is connected rigidly to the mirror 2, in embodiments that are not shown, the permanent magnet 3 is connected fixed in place and the solenoid coil 10 is connected rigidly to the mirror 2. In this case, the movably mounted solenoid coil 10 can cooperate with the end stop units 16, 18.

Instead of the magnetic drive 12, an electrostatic drive can also be used, which has a fixed first electrode and a second electrode connected rigidly to the mirror 2. In the electrical field of the electrostatic drive, the second electrode is tilted against the restoring force of the spring arms, wherein the second electrode cooperates with the end stop units 16, 18.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A device for two-dimensional deflection of a laser beam, comprising:
a substrate having a substrate opening;
a spring membrane positioned on the substrate about a spring membrane middle axis, wherein the spring membrane middle axis extends through the substrate opening and the spring membrane, wherein the spring membrane comprises
spring arms extending from the substrate and protrudes over the substrate opening, and
a middle section positioned over the substrate opening, wherein the middle section is supported by the spring arms and is mounted to be two-dimensionally tiltable and axially displaceable along the spring membrane middle axis;
a mirror coupled to the middle section of the spring membrane;
at least one of a magnetic and an electrostatic drive configured to tilt the mirror against a restoring force of the spring arms; and
one or more of a component coupled to the mirror and an end stop unit configured to limit an axial deflection of the middle section, at least in an axial direction along the spring membrane middle axis, to a distance that is within a range of axial deflection of the middle section, wherein an end of at least one of the spring arms that protrudes over the substrate opening into the movement path of the component coupled to the mirror is configured as the end stop unit.

2. The device of claim 1, wherein the end of the at least one spring arm that is configured as the end stop unit has a higher spring stiffness than the at least one spring arm.

3. The device of claim 1, wherein the component cooperating with the end stop unit is positioned on the side of the middle section opposite the mirror.

4. The device of claim 1, wherein the component cooperating with the end stop unit comprises at least one of the spring membrane, a permanent magnet, a solenoid coil of a magnetic drive, an electrode of an electrostatic drive, and a further component.

5. The device of claim 4, wherein the further component comprises at least one of a separate stop plate, and at least one projection of a spacer protruding radially outward located between a permanent magnet and the spring membrane.

6. The device of claim 1, wherein a damper is positioned between the end stop unit and the component cooperating therewith, and wherein the damper is coupled to one of the end stop unit and the component.

7. The device of claim 1, wherein the device for two-dimensional deflection of a laser beam is embodied in microelectromechanical systems technology.

8. The device of claim 1, wherein the spring arms can be elastically deflected out of a plane of the spring membrane.

9. The device of claim 1, wherein the spring arms extend from the edge of the substrate opening into the substrate opening.

10. The device of claim 1, wherein a force-exerting component of the magnetic or electrostatic drive is rigidly connected to the mirror.

11. The device of claim 1, wherein the spring membrane is positioned so as to be respectively spaced apart between the mirror and a force-exerting component of the magnetic or electrostatic drive.

12. A device for two-dimensional deflection of a laser beam, comprising:
a substrate having a substrate opening;
a spring membrane positioned on the substrate about a spring membrane middle axis, wherein the spring membrane middle axis extends through the substrate opening and the spring membrane, wherein the spring membrane comprises
spring arms extending from the substrate and protrudes over the substrate opening, and
a middle section positioned over the substrate opening, wherein the middle section is supported by the spring arms and is mounted to be two-dimensionally tiltable and axially displaceable along the spring membrane middle axis;

a mirror coupled to the middle section of the spring membrane;

at least one of a magnetic and an electrostatic drive configured to tilt the mirror against a restoring force of the spring arms; and one or more of a component coupled to the mirror and an end stop unit configured to limit an axial deflection of the middle section, at least in an axial direction along the spring membrane middle axis, to a distance that is within a range of axial deflection of the middle section, wherein the end stop unit is formed by an aperture diaphragm that protrudes into the substrate opening up into the movement path of the component.

13. The device of claim 12, wherein the aperture diaphragm is coupled to a side of the substrate opposite the spring membrane.

14. The device of claim 12, wherein the aperture diaphragm is positioned between the mirror and the spring membrane.

15. The device of claim 12, wherein the component cooperating with the end stop unit is positioned on the side of the middle section opposite the mirror.

16. The device of claim 12, wherein the component cooperating with the end stop unit comprises at least one of the spring membrane, a permanent magnet, a solenoid coil of a magnetic drive, an electrode of an electrostatic drive, and a further component.

17. The device of claim 16, wherein the further component comprises at least one of a separate stop plate, and at least one projection of a spacer protruding radially outward located between a permanent magnet and the spring membrane.

18. The device of claim 12, wherein a damper is positioned between the end stop unit and the component cooperating therewith, and wherein the damper is coupled to one of the end stop unit and the component.

19. The device of claim 12, wherein the device for two-dimensional deflection of a laser beam is embodied in microelectromechanical systems technology.

20. The device of claim 12, wherein a force-exerting component of the magnetic or electrostatic drive is rigidly connected to the mirror.

21. The device of claim 12, wherein the spring membrane is positioned so as to be respectively spaced apart between the mirror and a force-exerting component of the magnetic or electrostatic drive.

22. A device for two-dimensional deflection of a laser beam, comprising:

a substrate having a substrate opening;

a spring membrane positioned on the substrate about a spring membrane middle axis, wherein the spring membrane middle axis extends through the substrate opening and the spring membrane, wherein the spring membrane comprises spring arms extending from the substrate and protrudes over the substrate opening, and a middle section positioned over the substrate opening, wherein the middle section is supported by the spring arms and is mounted to be two-dimensionally tiltable and axially displaceable along the spring membrane middle axis;

a mirror coupled to the middle section of the spring membrane;

at least one of a magnetic and an electrostatic drive configured to tilt the mirror against a restoring force of the spring arms; and one or more of a component coupled to the mirror and an end stop unit configured to limit an axial deflection of the middle section, at least in an axial direction along the spring membrane middle axis, to a distance that is within a range of axial deflection of the middle section, wherein an axial deflection of the middle section along the spring membrane middle axis is delimited in a further axial direction along the spring membrane middle axis by a further end stop unit that cooperates with the component coupled to the mirror, wherein the further end stop unit is positioned along the spring membrane middle axis such that the component coupled to the mirror is positioned between the further end stop unit and the opening.

23. The device of claim 22, wherein the further end stop unit comprises at least one of an axially protruding spike and a stop plate.

24. The device of claim 22, wherein the component cooperating with the end stop unit is positioned on the side of the middle section opposite the mirror.

25. The device of claim 22, wherein the component cooperating with the end stop unit comprises at least one of the spring membrane, a permanent magnet, a solenoid coil of a magnetic drive, an electrode of an electrostatic drive, and a further component.

26. The device of claim 25, wherein the further component comprises at least one of a separate stop plate, and at least one projection of a spacer protruding radially outward located between a permanent magnet and the spring membrane.

27. The device of claim 22, wherein a damper is positioned between the end stop unit and the component cooperating therewith, and wherein the damper is coupled to one of the end stop unit and the component.

28. The device of claim 22, wherein the device for two-dimensional deflection of a laser beam is embodied in microelectromechanical systems technology.

29. The device of claim 22, wherein a force-exerting component of the magnetic or electrostatic drive is rigidly connected to the mirror.

30. The device of claim 22, wherein the spring membrane is positioned so as to be respectively spaced apart between the mirror and a force-exerting component of the magnetic or electrostatic drive.

* * * * *